United States Patent
Ooshima et al.

(10) Patent No.: US 7,956,660 B2
(45) Date of Patent: Jun. 7, 2011

(54) SIGNAL PROCESSING DEVICE

(75) Inventors: Satoru Ooshima, Tokyo (JP); Tatsuo Shimizu, Chiba (JP); Azuma Kawabe, Fukuoka (JP); Hidenobu Kakioka, Fukuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/408,827

(22) Filed: Mar. 23, 2009

(65) Prior Publication Data

US 2009/0243685 A1   Oct. 1, 2009

(30) Foreign Application Priority Data

Mar. 25, 2008   (JP) .................................. 2008-077787

(51) Int. Cl.
*H03K 3/017* (2006.01)
*H03K 5/04* (2006.01)
*H03K 7/08* (2006.01)
(52) U.S. Cl. ...................................... 327/175; 327/172
(58) Field of Classification Search .................. 327/175, 327/146–149, 155–158, 172
See application file for complete search history.

(56) References Cited

U.S. PATENT DOCUMENTS

| 7,049,866 B2 * | 5/2006 | Wilson ........................... 327/157 |
| 2007/0262798 A1 * | 11/2007 | Yun et al. ........................ 327/158 |

FOREIGN PATENT DOCUMENTS

| EP | 1 898 582 A1 | 3/2008 |
| JP | 6-61991 | 3/1994 |
| JP | 6-334496 | 12/1994 |
| JP | 2001-124813 | 5/2001 |
| JP | 2008-543184 | 11/2008 |

OTHER PUBLICATIONS

Office Action issued Aug. 2, 2010, in Japan Patent Application No. 2008-077787.

* cited by examiner

*Primary Examiner* — Lincoln Donovan
*Assistant Examiner* — Diana J Cheng
(74) *Attorney, Agent, or Firm* — Oblon, Spivak, McClelland, Maier & Neustadt, L.L.P.

(57) ABSTRACT

A signal processing device includes a correction circuit configured to correct the distortion of the duty cycle in a data signal having different occurrence probabilities of 0 and 1.

7 Claims, 10 Drawing Sheets

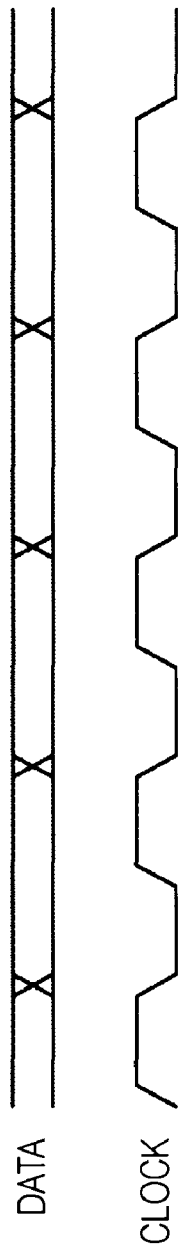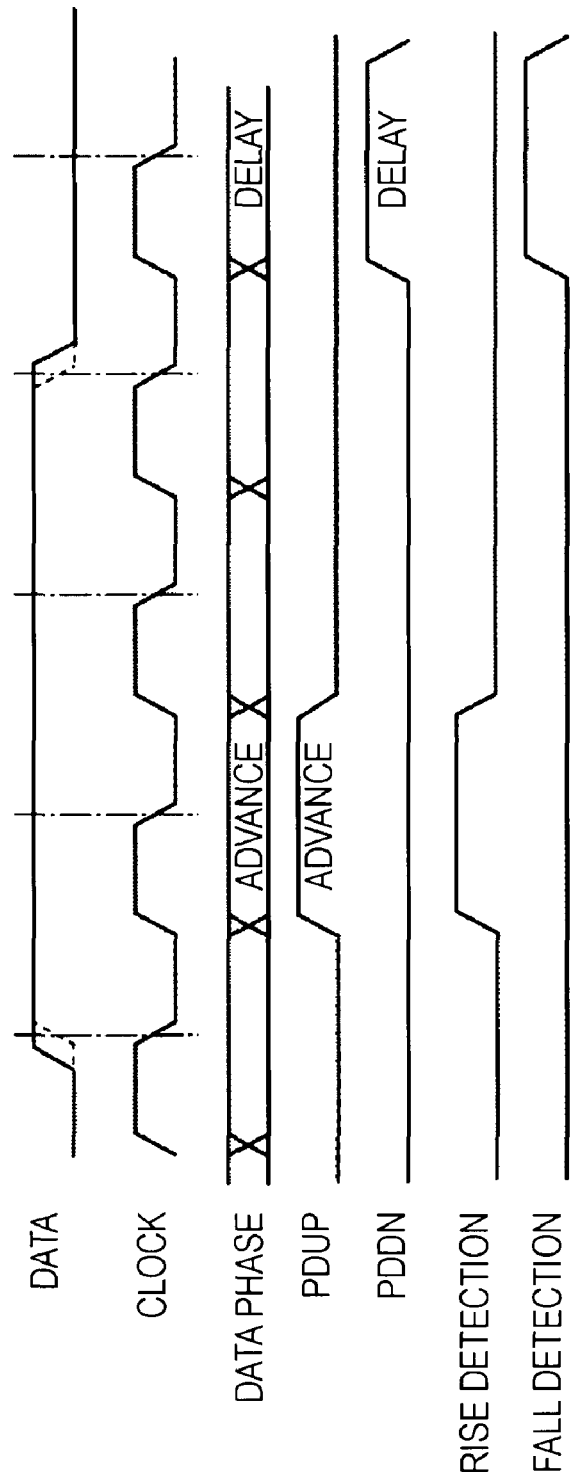

FIG. 7

| COUNT SUBTRACTION VALUE | INCREASE OR DECREASE IN DUTY ADJUSTMENT VALUE |
|---|---|
| +600 ≤ | -2 |
| +200 ≤ AND < +600 | -1 |
| -200 ≤ AND < +200 | ±0 |
| -600 ≤ AND < -200 | +1 |
| < -600 | +2 |

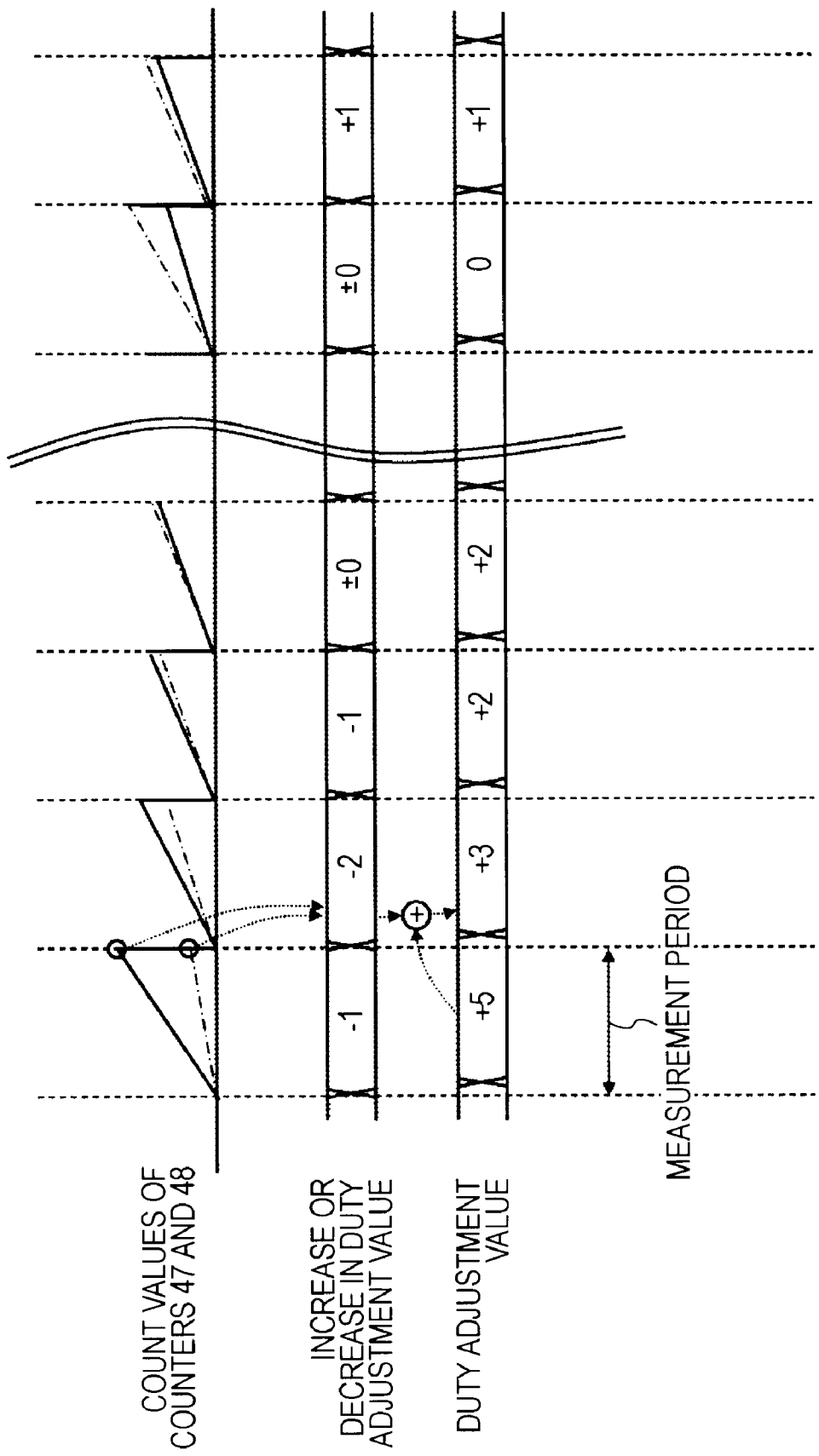

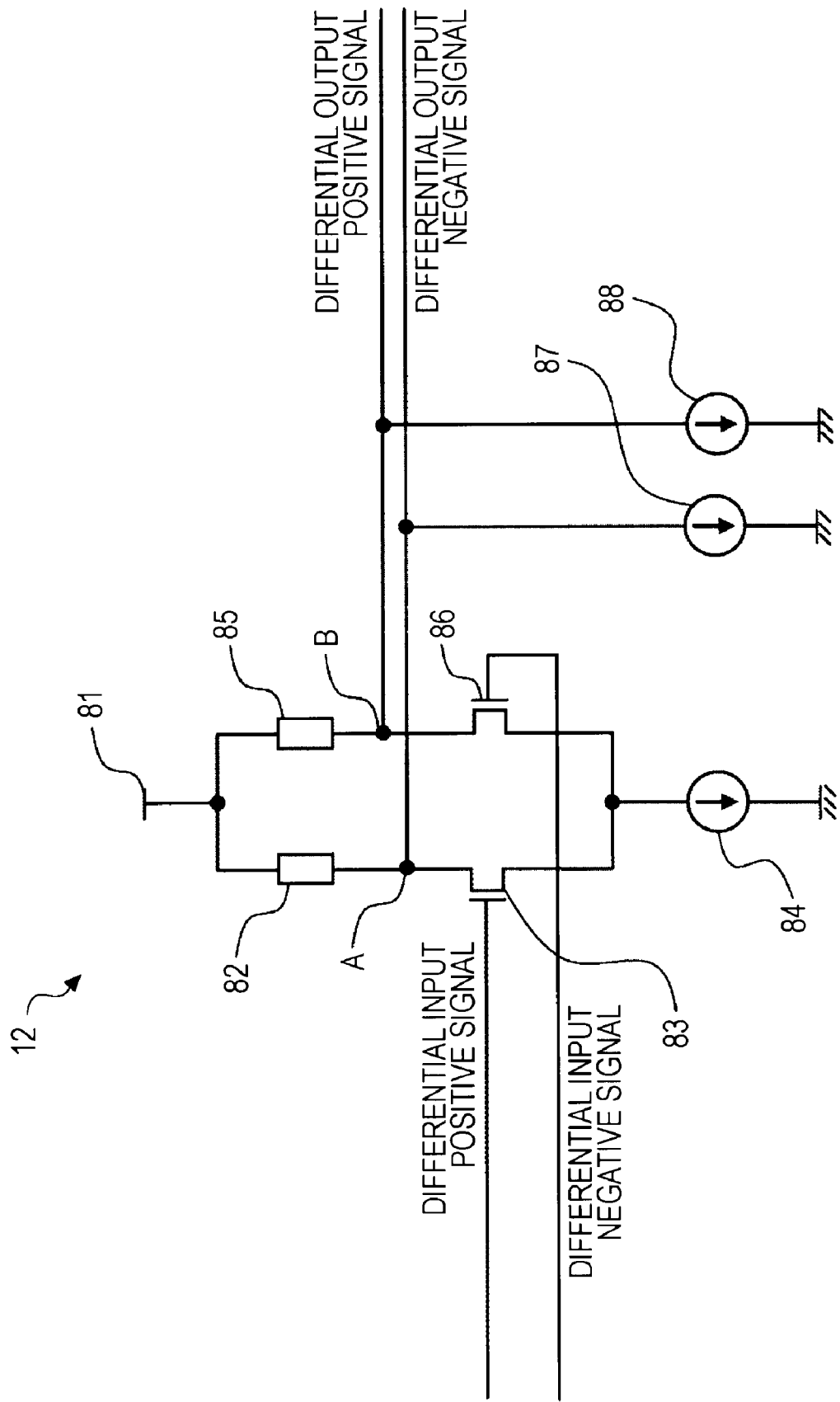

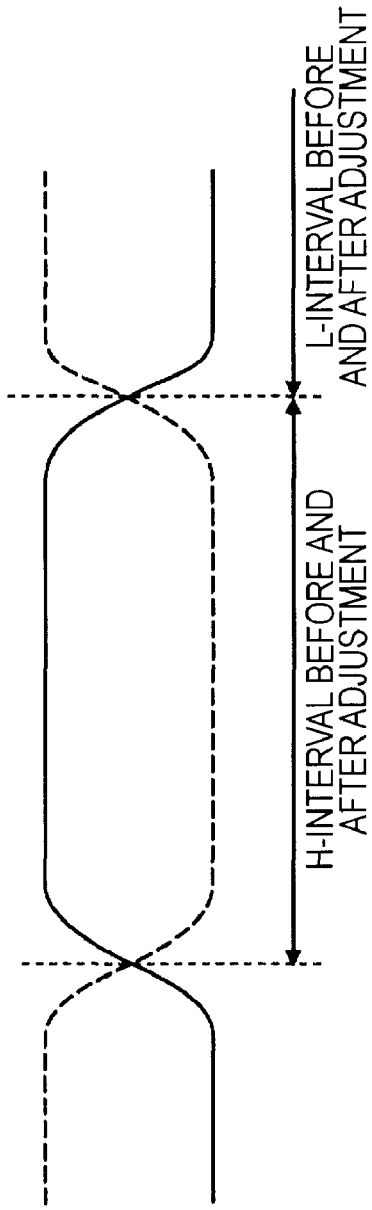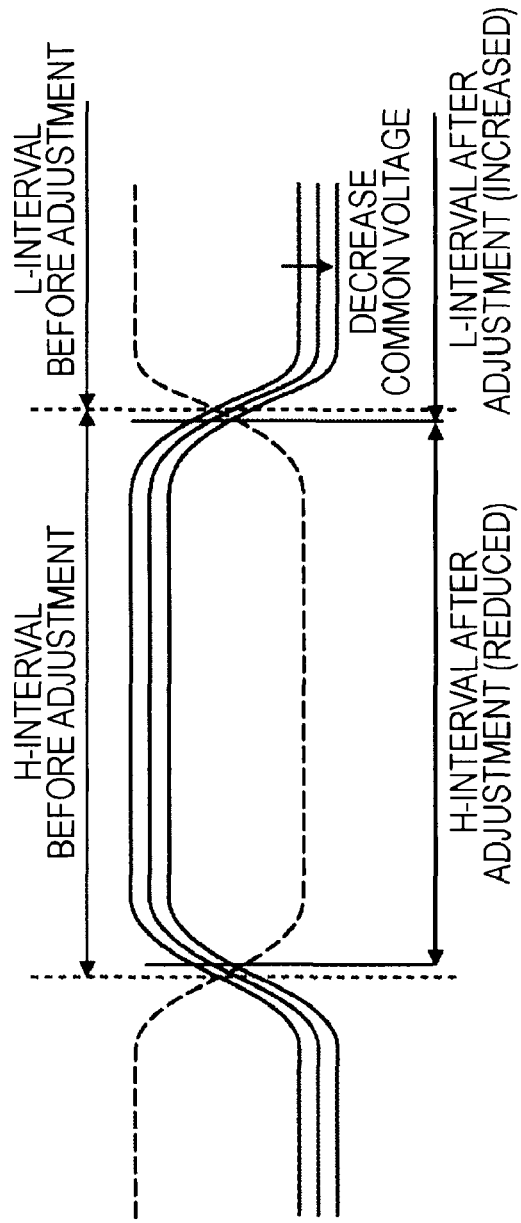

SIGNAL PROCESSING DEVICE

BACKGROUND OF THE INVENTION

1. Field of the Invention

The present invention relates to a signal processing device, particularly to a signal processing device capable of correcting the distortion of the duty cycle in a data signal having different occurrence probabilities of 0 and 1.

2. Description of the Related Art

If an input signal has a distorted duty cycle, or if the duty cycle of a signal is distorted by variation among transistors in a circuit inside an LSI (Large Scale Integration), the bit error rate of the signal is increased.

In view of this, a binarization circuit has been proposed which corrects the distortion of the duty cycle of, for example, an EFM (Eight-to-Fourteen Modulation) signal or an 8B/10B signal coded to have equal occurrence probabilities of 0 and 1 to maintain the DC (Direct Current) balance (see Japanese Unexamined Patent Application Publication No. 06-334496, for example).

SUMMARY OF THE INVENTION

The existing binarization circuit, however, corrects the distortion of the duty cycle in the EFM signal by generating a DC signal from the EFM signal at an LPF (Low-Pass Filter) and providing a feedback to a duty correction circuit such that the slice level of the DC signal is at the center between the L (Low) level and the H (High) level, for example. According to the existing binarization circuit, therefore, it is difficult to correct the distortion of the duty cycle in a data signal which has different occurrence probabilities of 0 and 1 and is not DC-balanced.

The present invention has been made in light of the above-described circumstances. It is desirable to enable the correction of the distortion of the duty cycle in a data signal having different occurrence probabilities of 0 and 1.

A signal processing device according to an embodiment of the present invention includes a correction circuit configured to correct the distortion of the duty cycle in a data signal having different occurrence probabilities of 0 and 1.

In the signal processing device according to the embodiment of the present invention, the correction circuit may include a phase detection circuit configured to detect an advance and a delay of the phase of the data signal, an edge detection circuit configured to detect a rise and a fall of the data signal, a distortion detection circuit configured to detect the distortion of the duty cycle on the basis of the result of the detection by the phase detection circuit and the edge detection circuit, and a duty adjustment circuit configured to adjust the duty cycle on the basis of the result of the detection by the distortion detection circuit, to thereby correct the distortion of the duty cycle.

In the signal processing device according to the embodiment of the present invention, the correction circuit may further include an adjustment value determination circuit configured to determine, on the basis of the frequency of detection of the distortion by the distortion detection circuit, an increase or decrease in a duty adjustment value which represents the degree of adjustment by the duty adjustment circuit. Further, the duty adjustment circuit may adjust the duty cycle on the basis of the increase or decrease in the duty adjustment value.

In the signal processing device according to the embodiment of the present invention, the distortion detection circuit may detect the distortion on the positive side and the negative side of the duty cycle. Further, when the difference between the frequency of detection of the distortion on the positive side of the duty cycle by the distortion detection circuit and the frequency of detection of the distortion on the negative side of the duty cycle by the distortion detection circuit is a value within a predetermined range, the adjustment value determination circuit may determine the increase or decrease in the duty adjustment value to be zero.

In the signal processing device according to the embodiment of the present invention, the distortion detection circuit may detect the distortion of the duty cycle on the basis of the combination of the result of the detection by the phase detection circuit and the result of the detection by the edge detection circuit.

In the signal processing device according to the embodiment of the present invention, the phase detection circuit may include an Alexander-type phase comparator.

In the embodiment of the present invention, the distortion of the duty cycle in a data signal having different occurrence probabilities of 0 and 1 is corrected.

As described above, according to the embodiment of the present invention, the distortion of the duty cycle in a data signal having different occurrence probabilities of 0 and 1 can be corrected.

BRIEF DESCRIPTION OF THE DRAWINGS

FIG. 2 is a timing chart for explaining the operation of a clock data recovery circuit;

FIG. 3 is a timing chart for explaining changes in respective signals in a case in which the distortion is present on the positive side of the duty cycle;

FIG. 7 is a diagram illustrating an example of an adjustment value increase or decrease table;

FIG. 8 is a timing chart for explaining a specific method of determining an increase or decrease in a duty adjustment value;

FIG. 9 is a block diagram illustrating a detailed configuration example of a duty adjustment circuit of FIG. 1;

FIG. 10 is a diagram for explaining a change in common voltage when the increase or decrease in the duty adjustment value is 0;

FIG. 11 is a diagram for explaining a change in common voltage when the increase or decrease in the duty adjustment value is −1 or smaller.

DESCRIPTION OF THE PREFERRED EMBODIMENTS

Figure 1:
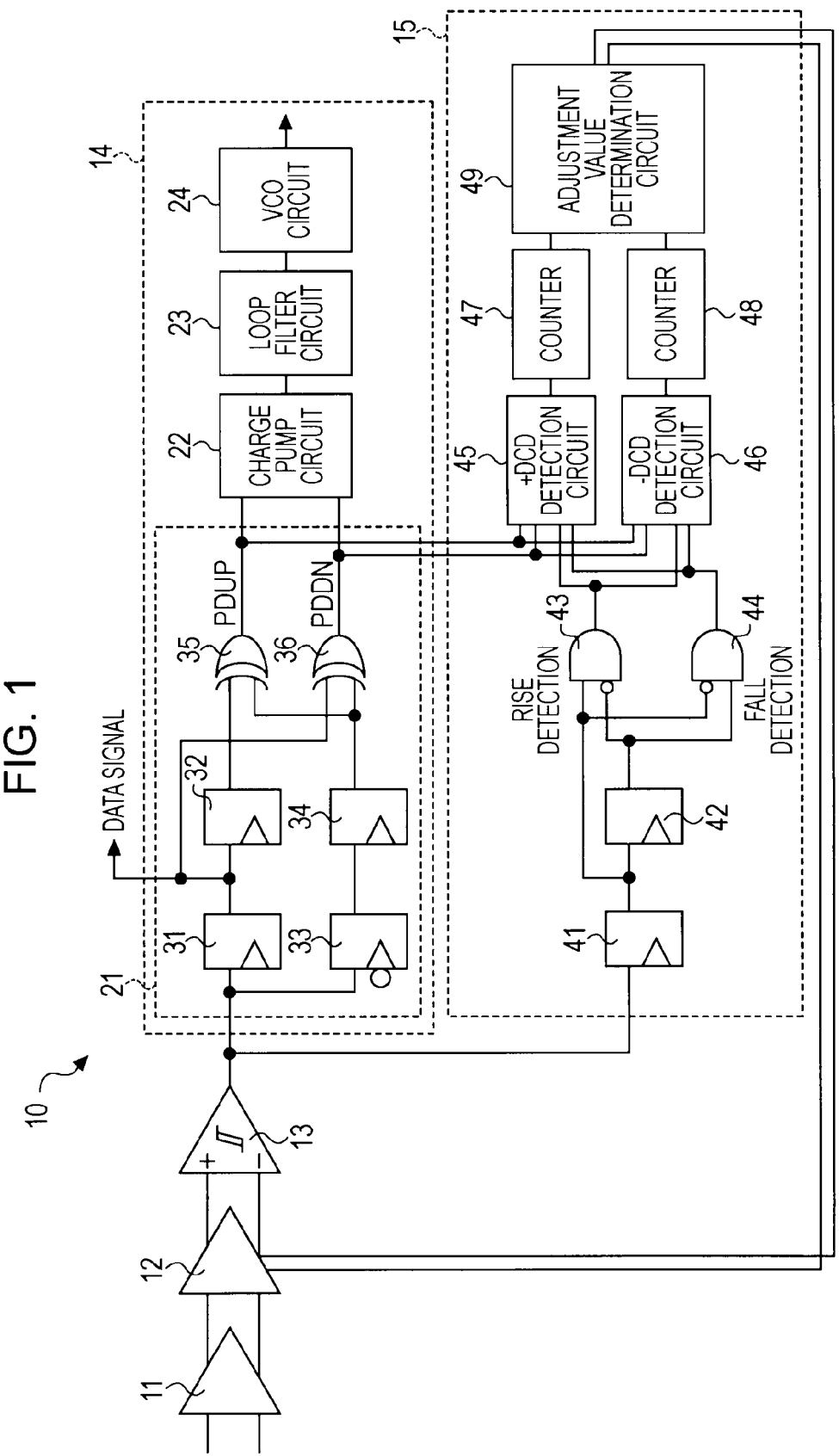
FIG. 1 is a block diagram illustrating a configuration example of a signal processing device according to an embodiment of the present invention.

FIG. 1 illustrates a configuration example of a signal processing device according to an embodiment of the present invention.

A signal processing device 10 of FIG. 1 is configured to include an amplifier 11, a duty adjustment circuit 12, a comparator 13, a clock data recovery circuit 14, and a duty cycle distortion detection circuit 15.

The amplifier 11 of the signal processing device 10 amplifies, for example, a CML (Current Mode Logic) signal or an LVDS (Low Voltage Differential Signaling) signal functioning as a differential signal of a data signal. The duty adjustment circuit 12 receives from the duty cycle distortion detection circuit 15 the input of a duty positive signal for adjusting the duty cycle toward the positive side or a duty negative signal for adjusting the duty cycle toward the negative side. The positive side of the duty cycle refers to the direction in which the duty ratio increases, while the negative side of the duty cycle refers to the direction in which the duty ratio decreases.

On the basis of the duty positive signal or the duty negative signal, the duty adjustment circuit 12 adjusts a common voltage of the differential signal of the data signal amplified by the amplifier 11, to thereby adjust the duty cycle of the data signal. Accordingly, the distortion of the duty cycle in the data signal is corrected. Details of the duty adjustment circuit 12 will be described with reference to FIG. 9 described later.

The comparator 13 converts the differential signal of the data signal, the duty cycle distortion of which has been corrected by the duty adjustment circuit 12, into a single-ended data signal. The converted data signal is input to the clock data recovery circuit 14 and the duty cycle distortion detection circuit 15.

In the present example, the differential signal of the data signal is converted into the single-ended data signal by the comparator 13. Alternatively, the signal processing device 10 may be configured to differentially operate all circuits at subsequent stages without converting the differential signal of the data signal into the single-ended data signal.

The clock data recovery circuit 14 is configured to include a phase detection circuit 21, a charge pump circuit 22, a loop filter circuit 23, and a VCO (Voltage Controlled Oscillator) circuit 24, and generates a clock signal in synchronization with the data signal.

The phase detection circuit 21, which is an Alexander-type phase comparator, detects whether the phase of the data signal is advanced or delayed with respect to the phase of the clock signal.

Specifically, the phase detection circuit 21 is configured to include flip-flop circuits 31 to 34 and EX-OR (Exclusive-OR) circuits 35 and 36. Using the clock signal, the flip-flop circuit 31 samples the single-ended data signal input by the comparator 13. The sampled data signal is input to the flip-flop circuit 32, the EX-OR circuit 36, and a not-illustrated block at a subsequent stage.

Using the clock signal, the flip-flop circuit 32 holds the data signal received from the flip-flop circuit 31, and outputs the held data signal to the EX-OR circuit 35. Using an inversion signal of the clock signal, the flip-flop circuit 33 samples the single-ended data signal input by the comparator 13.

Using the clock signal, the flip-flop circuit 34 holds the data signal sampled by the flip-flop circuit 33, and outputs the held data signal to the EX-OR circuits 35 and 36. The EX-OR circuit 35 calculates the exclusive logical sum of the data signal received from the flip-flop circuit 32 and the data signal received from the flip-flop circuit 34. Thereby, the advance of the phase of the data signal with respect to the phase of the clock signal is detected.

A signal obtained as a result of the calculation by the EX-OR circuit 35 is input to the charge pump circuit 22 and the duty cycle distortion detection circuit 15 as a PDUP signal which indicates that the phase of the data signal is advanced with respect to the phase of the clock signal. If the phase of the data signal is advanced with respect to the phase of the clock signal, the level of the PDUP signal rises to the H level. If the phase of the data signal is not advanced with respect to the phase of the clock signal, the level of the PDUP signal falls to the L level.

The EX-OR circuit 36 calculates the exclusive logical sum of the data signal received from the flip-flop circuit 31 and the data signal received from the flip-flop circuit 34. Thereby, the delay of the phase of the data signal with respect to the phase of the clock signal is detected. A signal obtained as a result of the calculation by the EX-OR circuit 36 is input to the charge pump circuit 22 and the duty cycle distortion detection circuit 15 as a PDDN signal which indicates that the phase of the data signal is delayed with respect to the phase of the clock signal.

If the phase of the data signal is delayed with respect to the phase of the clock signal, the level of the PDDN signal rises to the H level. If the phase of the data signal is not delayed with respect to the phase of the clock signal, the level of the PDDN signal falls to the L level.

As the phase detection circuit 21 of the clock data recovery circuit 14, a phase comparator other than the Alexander-type phase comparator can also be used. In the Alexander-type phase comparator, however, a phase result is not output in small pulses, unlike in an analog phase comparator. Instead, the phase result is output in the pulses of the clock signal. Therefore, the use of the Alexander-type phase comparator makes it easy to design the signal processing device 10.

In accordance with the PDUP signal received from the EX-OR circuit 35 and the PDDN signal received from the EX-OR circuit 36, the charge pump circuit 22 acts as a source for supplying current to the loop filter circuit 23 and a sink for drawing current from the loop filter circuit 23. Specifically, for example, if the level of the PDUP signal is at the H level, the charge pump circuit 22 supplies current to the loop filter circuit 23. Further, if the level of the PDDN signal is at the H level, the charge pump circuit 22 draws current from the loop filter circuit 23.

The loop filter circuit 23, which is a circuit for stabilizing loop control, eliminates high-frequency components of a voltage changed by the charge pump circuit 22, and inputs a resultant voltage to the VCO circuit 24. The VCO circuit 24 generates a clock signal having a frequency corresponding to the DC voltage received from the loop filter circuit 23. For example, therefore, an increase in the DC voltage increases the frequency of the clock signal, while a decrease in the DC voltage reduces the frequency of the clock signal.

As described above, the clock data recovery circuit 14 detects the advance and delay of the phase of the data signal with respect to the phase of the clock signal, and changes the frequency of the clock signal in accordance with the result of the detection. Therefore, the clock data recovery circuit 14 can generate the clock signal in synchronization with the data signal. The thus generated clock signal is input to and used by the flip-flop circuits 31 to 34 and later-described flip-flop circuits 41 and 42 of the duty cycle distortion detection circuit 15.

The duty cycle distortion detection circuit 15 is configured to include the flip-flop circuits 41 and 42, AND circuits 43 and 44, a +DCD detection circuit 45, a −DCD detection circuit 46, counters 47 and 48, and an adjustment value determination circuit 49, and detects the distortion of the duty cycle in the data signal.

Specifically, the flip-flop circuits 41 and 42 and the AND circuits 43 and 44 (an edge detection circuit) detect the rise and fall of the data signal. More in detail, using the clock signal, the flip-flop circuit 41 samples the single-ended data signal input by the comparator 13, and outputs the sampled data signal. Then, using the clock signal, the flip-flop circuit 42 holds the data signal received from the flip-flop circuit 41, and outputs the held data signal.

The AND circuit 43 receives the input of the data signal output by the flip-flop circuit 41 and the input of an inversion signal of the data signal output by the flip-flop circuit 42. The AND circuit 43 calculates the logical product of the data signal received from the flip-flop circuit 41 and the inversion signal of the data signal received from the flip-flop circuit 42. Thereby, the rise of the data signal is detected.

A signal obtained as a result of the calculation by the AND circuit 43 is input to the +DCD detection circuit 45 and the −DCD detection circuit 46 as a rise detection signal which indicates the rise of the data signal. If the data signal rises, the level of the rise detection signal rises to the H level. If the data signal has not risen, the level of the rise detection signal is at the L level.

The AND circuit 44 receives the input of an inversion signal of the data signal output by the flip-flop circuit 41 and the input of the data signal output by the flip-flop circuit 42. The AND circuit 44 calculates the logical product of the inversion signal of the data signal received from the flip-flop circuit 41 and the data signal received from the flip-flop circuit 42. Thereby, the fall of the data signal is detected.

A signal obtained as a result of the calculation by the AND circuit 44 is input to the +DCD detection circuit 45 and the −DCD detection circuit 46 as a fall detection signal which indicates the fall of the data signal. If the data signal falls, the level of the fall detection signal rises to the H level. If the data signal has not fallen, the level of the fall detection signal is at the L level.

On the basis of the PDUP signal input by the EX-OR circuit 35 of the clock data recovery circuit 14, the PDDN signal input by the EX-OR circuit 36 of the clock data recovery circuit 14, the rise detection signal input by the AND circuit 43, and the fall detection signal input by the AND circuit 44, the +DCD detection circuit 45 (a distortion detection circuit) detects the distortion on the positive side of the duty cycle. Then, the +DCD detection circuit 45 inputs to the counter 47 a positive distortion detection signal which indicates the detection of the distortion on the positive side of the duty cycle.

On the basis of the PDUP signal input by the EX-OR circuit 35 of the clock data recovery circuit 14, the PDDN signal input by the EX-OR circuit 36 of the clock data recovery circuit 14, the rise detection signal input by the AND circuit 43, and the fall detection signal input by the AND circuit 44, the −DCD detection circuit 46 (a distortion detection circuit) detects the distortion on the negative side of the duty cycle. Then, the −DCD detection circuit 46 inputs to the counter 48 a negative distortion detection signal which indicates the detection of the distortion on the negative side of the duty cycle.

The counter 47 increments the count value thereof in accordance with the positive distortion detection signal. Therefore, the count value of the counter 47 represents the frequency of detection of the distortion on the positive side of the duty cycle. Further, the counter 47 inputs the count value to the adjustment value determination circuit 49.

The counter 48 increments the count value thereof in accordance with the negative distortion detection signal. Therefore, the count value of the counter 48 represents the frequency of detection of the distortion on the negative side of the duty cycle. Further, the counter 48 inputs the count value to the adjustment value determination circuit 49.

For each predetermined measurement period, the adjustment value determination circuit 49 subtracts the count value of the counter 48 from the count value of the counter 47 to obtain a count subtraction value. Further, the adjustment value determination circuit 49 includes a holding circuit (not illustrated) which holds a table associating the count subtraction value with an increase or decrease in a duty adjustment value (hereinafter referred to as the adjustment value increase or decrease table). The duty adjustment value refers to the value representing the degree of adjustment by the duty adjustment circuit 12.

With reference to the adjustment value increase or decrease table, the adjustment value determination circuit 49 determines the increase or decrease in the duty adjustment value corresponding to the subtraction value calculated for each predetermined period. Further, in accordance with the increase or decrease in the duty adjustment value, the adjustment value determination circuit 49 feeds back to the duty adjustment circuit 12 the duty positive signal which represents an increase in the duty adjustment value or the duty negative signal which represents a decrease in the duty adjustment value.

As described above, the signal processing device 10 detects the advance and delay of the phase of the data signal with respect to the phase of the clock signal, and detects the rise and fall of the data signal. Therefore, the signal processing device 10 can detect and correct the distortion of the duty cycle, even if the data signal has different occurrence probabilities of 0 and 1 depending on the phase at the rise and fall of the data signal.

As a result, the signal processing device 10 corrects the distortion of the duty cycle caused by characteristic variation among transistors, for example. Accordingly, the signal processing device 10 can be designed without the variation among transistors taken into account.

The signal processing device 10 can be installed in a high-speed gigabit transmission system which transmits a high-speed data signal of a few GBps (Gigabits per second), for example, as a receiver for receiving the data signal. In this case, the signal processing device 10 receives the data signal transmitted from a transmitter through a coaxial cable or a transmission path such as a strip line on a printed board, for example. Then, the signal processing device 10 corrects the distortion of the duty cycle in the data signal.

Accordingly, the bit error rate and the eye pattern of the data signal can be improved. As a result, the transmission rate can be improved. Further, the signal processing device 10 can correct the distortion of the duty cycle occurring in the transmission path. Therefore, the distance of the transmission path can be increased.

Subsequently, with reference to the timing chart of FIG. 2, the operation of the clock data recovery circuit 14 will be described.

If the sampling point of a data signal (DATA) corresponds to the rise of a clock signal (CLOCK), the clock data recovery circuit 14 operates to maximize the setup time and the hold time of the data signal, as illustrated in FIG. 2.

Specifically, if the phase of the data signal is advanced with respect to the phase of the clock signal, the phase detection circuit 21 outputs the PDUP signal of the H level. As a result, the frequency of the clock signal generated by the VCO circuit 24 is increased, and the phase of the clock signal is advanced. Meanwhile, if the phase of the data signal is delayed with respect to the phase of the clock signal, the phase detection circuit 21 outputs the PDDN signal of the H level.

As a result, the frequency of the clock signal generated by the VCO circuit 24 is reduced, and the phase of the clock signal is delayed.

In the above-described manner, the clock data recovery circuit 14 maximizes the setup time and the hold time of the data signal. That is, the clock data recovery circuit 14 generates the clock signal in synchronization with the data signal.

Subsequently, with reference to the timing charts of FIGS. 3 to 6, the detection operation of the duty cycle distortion detection circuit 15 will be described. For convenience of explanation, a data signal having no distortion of the duty cycle and in synchronization with the clock signal is indicated by a broken line in FIGS. 3 to 6.

Firstly, with reference to FIG. 3, description will be made of changes in the respective signals in a case in which the phase of the data signal and the phase of the clock signal match but the distortion is present on the positive side of the duty cycle in the data signal.

In this case, as illustrated in FIG. 3, at the rise of the data signal, the edge phase of the data signal (the data phase) is advanced with respect to the edge phase of the clock signal. Further, at the fall of the data signal, the edge phase of the data signal is delayed with respect to the edge phase of the clock signal. Therefore, as the data signal rises, the level of the PDUP signal rises to the H level. Further, as the data signal falls, the level of the PDDN signal rises to the H level.

As a result, when the data signal rises, the phase of the clock signal is advanced. Further, when the data signal falls, the phase of the clock signal is delayed. Thereby, the setup time and the hold time of the data signal are maximized. In the example of FIG. 3, the amount of advance and the amount of delay are the same in the edge phase of the data signal. Thus, the phase of the clock signal is advanced or delayed by the same amount.

Further, as illustrated in FIG. 3, as the data signal rises, the level of the rise detection signal rises to the H level. Further, as the data signal falls, the level of the fall detection signal rises to the H level.

Therefore, in the case in which the phase of the data signal and the phase of the clock signal match but the distortion is present on the positive side of the duty cycle in the data signal, as illustrated in FIG. 3, the level of the PDUP signal is at the H level when the rise detection signal is at the H level, and the level of the PDDN signal is at the H level when the fall detection signal is at the H level.

Subsequently, with reference to FIG. 4, description will be made of changes in the respective signals in a case in which the phase of the data signal and the phase of the clock signal match but the distortion is present on the negative side of the duty cycle in the data signal.

Figure 4:
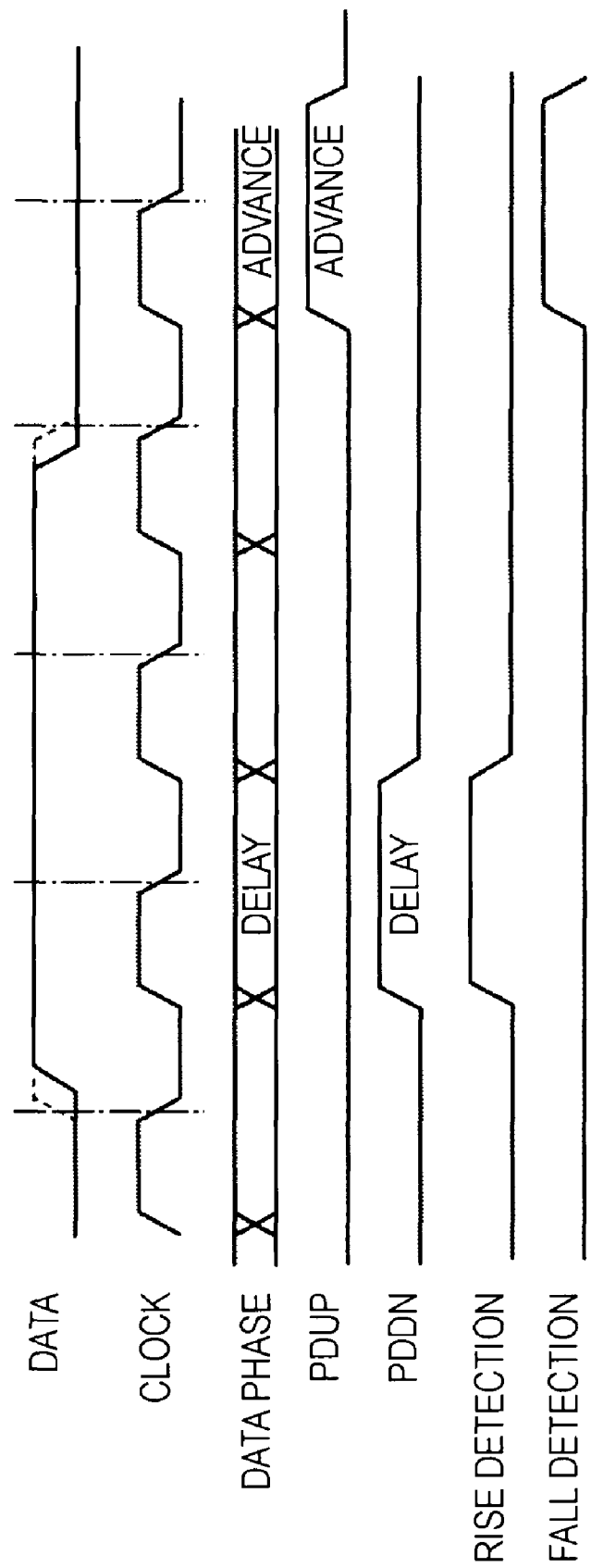
FIG. 4 is a timing chart for explaining changes in the respective signals in a case in which the distortion is present on the negative side of the duty cycle.

In this case, as illustrated in FIG. 4, at the rise of the data signal, the edge phase of the data signal (the data phase) is delayed with respect to the edge phase of the clock signal. Further, at the fall of the data signal, the edge phase of the data signal is advanced with respect to the edge phase of the clock signal. Therefore, as the data signal rises, the level of the PDDN signal rises to the H level. Further, as the data signal falls, the level of the PDUP signal rises to the H level. As a result, when the data signal rises, the phase of the clock signal is delayed. Further, when the data signal falls, the phase of the clock signal is advanced. Also in the example of FIG. 4, the amount of advance and the amount of delay are the same in the edge phase of the data signal. Thus, the phase of the clock signal is advanced or delayed by the same amount.

Further, as illustrated in FIG. 4, the level of the rise detection signal and the level of the fall detection signal change similarly as in the example of FIG. 3. Therefore, in the case in which the phase of the data signal and the phase of the clock signal match but the distortion is present on the negative side of the duty cycle in the data signal, as illustrated in FIG. 4, the level of the PDDN signal is at the H level when the rise detection signal is at the H level, and the level of the PDUP signal is at the H level when the fall detection signal is at the H level.

Subsequently, with reference to FIG. 5, description will be made of changes in the respective signals in a case in which the distortion of the duty cycle is absent in the data signal but the phase of the data signal is advanced with respect to the phase of the clock signal.

Figure 5:
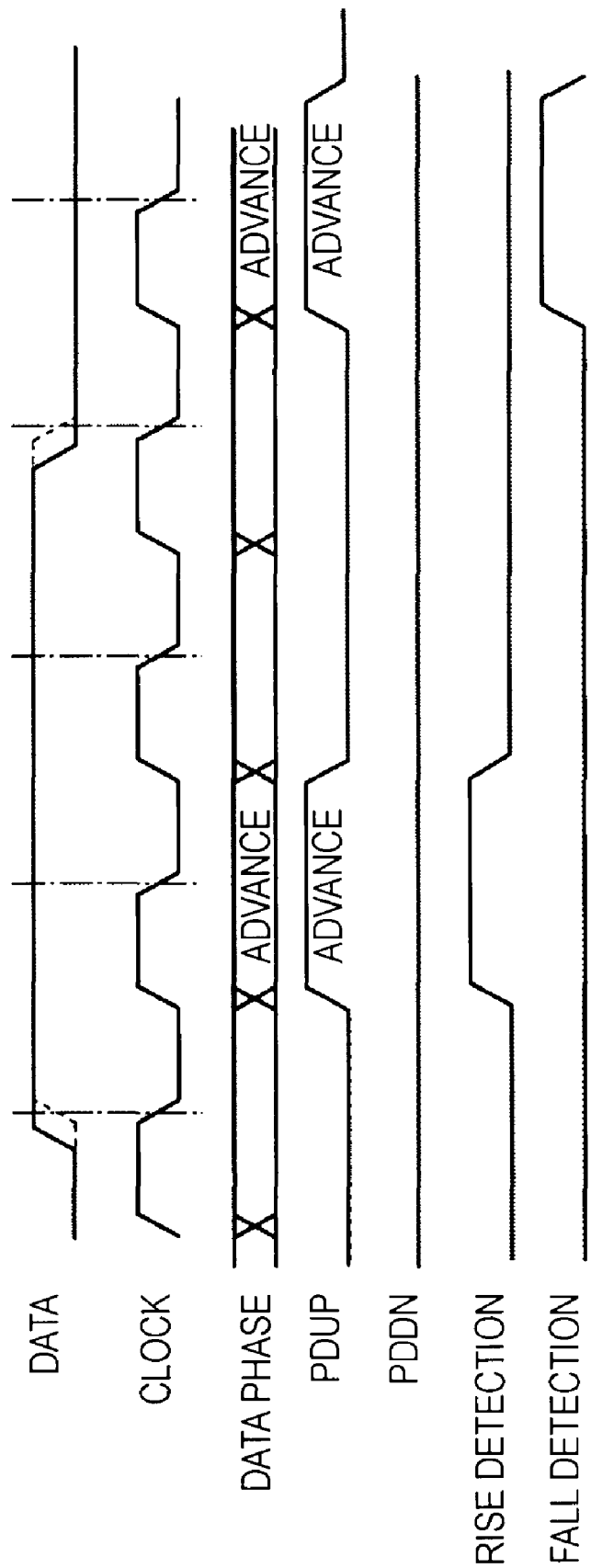
FIG. 5 is a timing chart for explaining changes in the respective signals in a case in which the distortion of the duty cycle is absent in a data signal.

In this case, as illustrated in FIG. 5, at the rise and fall of the data signal, the edge phase of the data signal (the data phase) is advanced with respect to the edge phase of the clock signal by the same amount. Therefore, as the data signal rises and falls, the level of the PDUP signal rises to the H level. As a result, when the data signal rises and falls, the phase of the clock signal is advanced.

Further, as illustrated in FIG. 5, the level of the rise detection signal and the level of the fall detection signal change similarly as in the example of FIG. 3. Therefore, in the case in which the distortion of the duty cycle is absent in the data signal but the phase of the data signal is advanced with respect to the phase of the clock signal, as illustrated in FIG. 5, the level of the PDUP signal is at the H level both when the rise detection signal is at the H level and when the fall detection signal is at the H level.

Subsequently, with reference to FIG. 6, description will be made of changes in the respective signals in a case in which the distortion of the duty cycle is absent in the data signal but the phase of the data signal is delayed with respect to the phase of the clock signal.

Figure 6:
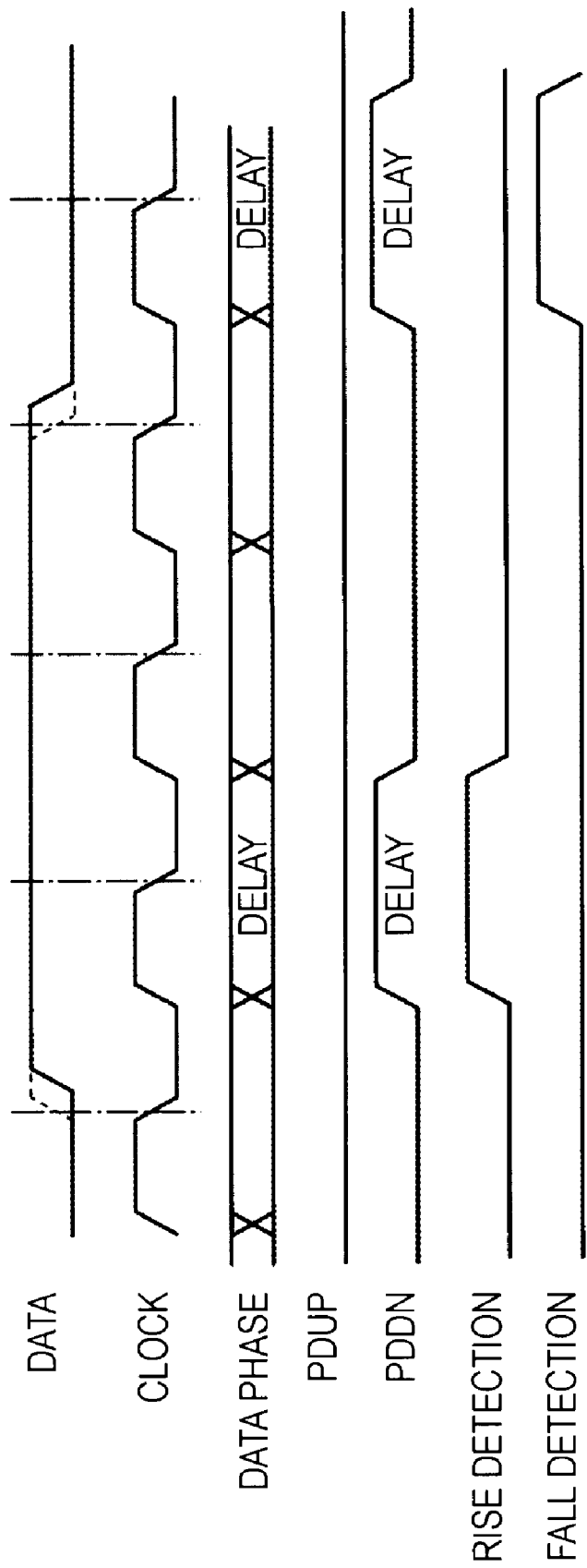
FIG. 6 is a timing chart for explaining changes in the respective signals in another case in which the distortion of the duty cycle is absent in a data signal.

In this case, as illustrated in FIG. 6, at the rise and fall of the data signal, the edge phase of the data signal (the data phase) is delayed with respect to the edge phase of the clock signal by the same amount. Therefore, as the data signal rises and falls, the level of the PDDN signal rises to the H level. As a result, when the data signal rises and falls, the phase of the clock signal is delayed.

Further, as illustrated in FIG. 6, the level of the rise detection signal and the level of the fall detection signal change similarly as in the example of FIG. 3. Therefore, in the case in which the distortion of the duty cycle is absent in the data signal but the phase of the data signal is delayed with respect to the phase of the clock signal, as illustrated in FIG. 6, the level of the PDDN signal is at the H level both when the rise detection signal is at the H level and when the fall detection signal is at the H level.

As described above, the respective levels of the PDUP signal and the PDDN signal at the H level of the rise detection signal or the fall detection signal vary depending on the distortion state of the duty cycle.

Therefore, on the basis of the combination of the H-level PDUP signal or PDDN signal and the H-level rise detection signal or fall detection signal, the duty cycle distortion detection circuit 15 detects the distortion on the positive and negative sides of the duty cycle.

Specifically, if the +DCD detection circuit 45 detects that the respective levels of the rise detection signal and the PDUP signal are at the H level (hereinafter referred to as the rise PDUP signal detection) or that the respective levels of the fall detection signal and the PDDN signal are at the H level (hereinafter referred to as the fall PDDN signal detection), the +DCD detection circuit 45 detects the distortion on the positive side of the duty cycle, and increments the count value of the counter 47 by one.

Further, if the −DCD detection circuit 46 detects that the respective levels of the rise detection signal and the PDDN signal are at the H level (hereinafter referred to as the rise PDDN signal detection) or that the respective levels of the fall detection signal and the PDUP signal are at the H level (hereinafter referred to as the fall PDUP signal detection), the −DCD detection circuit 46 detects the distortion on the negative side of the duty cycle, and increments the count value of the counter 48 by one.

As described above, the +DCD detection circuit 45 performs both the rise PDUP signal detection and the fall PDDN signal detection, and the −DCD detection circuit 46 performs both the rise PDDN signal detection and the fall PDUP signal detection. Accordingly, in the case in which the distortion of the duty cycle is absent but the data signal and the clock signal do not match in phase, as illustrated in FIGS. 5 and 6, the absence of the distortion of the duty cycle can be detected.

Specifically, in the case in which the distortion of the duty cycle is absent in the data signal but the phase of the data signal is advanced with respect to the phase of the clock signal, as described in FIG. 5, the level of the PDUP signal is at the H level when the level of the rise detection signal is at the H level. Therefore, the +DCD detection circuit 45 detects the distortion on the positive side of the duty cycle, and increments the count value of the counter 47 by one.

Further, the level of the PDUP signal is at the H level when the level of the fall detection signal is at the H level. Therefore, the −DCD detection circuit 46 detects the distortion on the negative side of the duty cycle, and increments the count value of the counter 48 by one.

However, the adjustment value determination circuit 49 subtracts the count value of the counter 48 from the count value of the counter 47. Therefore, herein, the increment in the count value of the counter 47 and the increment in the count value of the counter 48 are offset. Accordingly, the count subtraction value calculated by the adjustment value determination circuit 49 in this case is equal to the count subtraction value obtained when the count value has not been incremented both in the counters 47 and 48, i.e., when the absence of the distortion of the duty cycle has been detected.

Further, in the case in which the distortion of the duty cycle is absent in the data signal but the phase of the data signal is delayed with respect to the phase of the clock signal, as described in FIG. 6, the level of the PDDN signal is at the H level when the level of the rise detection signal is at the H level. Therefore, the −DCD detection circuit 46 detects the distortion on the negative side of the duty cycle, and increments the count value of the counter 48 by one.

Further, the level of the PDDN signal is at the H level when the level of the fall detection signal is at the H level. Therefore, the +DCD detection circuit 45 detects the distortion on the positive side of the duty cycle, and increments the count value of the counter 47 by one.

As described above, however, the adjustment value determination circuit 49 subtracts the count value of the counter 48 from the count value of the counter 47. Therefore, the count subtraction value calculated in this case is equal to the count subtraction value obtained when the absence of the distortion of the duty cycle has been detected.

Alternatively, the +DCD detection circuit 45 may be configured to perform either one of the rise PDUP signal detection and the fall PDDN signal detection to detect the distortion on the positive side of the duty cycle. Further, the −DCD detection circuit 46 may be configured to perform either one of the rise PDDN signal detection and the fall PDUP signal detection to detect the distortion on the negative side of the duty cycle.

However, in the case in which the distortion of the duty cycle is absent in the data signal but the data signal and the clock signal do not match in phase, as illustrated in FIGS. 5 and 6, it is necessary that the absence of the distortion of the duty cycle is detected.

In this case, therefore, the following first and second methods are provided as the detection method performed by the +DCD detection circuit 45 and the −DCD detection circuit 46.

In the first method, the +DCD detection circuit 45 performs the rise PDUP signal detection, and the −DCD detection circuit 46 performs the fall PDUP signal detection. According to the method, in the case in which the distortion of the duty cycle is absent in the data signal but the phase of the data signal is advanced with respect to the phase of the clock signal, as illustrated in FIG. 5, the +DCD detection circuit 45 detects the distortion on the positive side of the duty cycle. Further, the −DCD detection circuit 46 detects the distortion on the negative side of the duty cycle. Accordingly, the absence of the distortion of the duty cycle is detected.

Further, in the case in which the distortion of the duty cycle is absent in the data signal but the phase of the data signal is delayed with respect to the phase of the clock signal, as illustrated in FIG. 6, the +DCD detection circuit 45 does not detect the distortion on the positive side of the duty cycle. Further, the −DCD detection circuit 46 does not detect the distortion on the negative side of the duty cycle. Accordingly, the absence of the distortion of the duty cycle is detected.

In the second method, the +DCD detection circuit 45 performs the fall PDDN signal detection, and the −DCD detection circuit 46 performs the rise PDDN signal detection. According to the method, in the case in which the distortion of the duty cycle is absent in the data signal but the phase of the data signal is advanced with respect to the phase of the clock signal, as illustrated in FIG. 5, the +DCD detection circuit 45 does not detect the distortion on the positive side of the duty cycle. Further, the −DCD detection circuit 46 does not detect the distortion on the negative side of the duty cycle. Accordingly, the absence of the distortion of the duty cycle is detected.

Further, in the case in which the distortion of the duty cycle is absent in the data signal but the phase of the data signal is delayed with respect to the phase of the clock signal, as illustrated in FIG. 6, the +DCD detection circuit 45 detects the distortion on the positive side of the duty cycle. Further, the −DCD detection circuit 46 detects the distortion on the negative side of the duty cycle. Accordingly, the absence of the distortion of the duty cycle is detected.

In a case in which the distortion of the duty cycle is detected only when the clock data recovery circuit 14 is locked, the following third and fourth methods can be employed as the detection method performed by the +DCD detection circuit 45 and the −DCD detection circuit 46.

In the third method, the +DCD detection circuit 45 performs the rise PDUP signal detection and the −DCD detection circuit 46 performs the rise PDDN signal detection.

According to the method, if the clock data recovery circuit 14 is not locked, and if the distortion of the duty cycle is absent in the data signal but the phase of the data signal is advanced with respect to the phase of the clock signal, as illustrated in FIG. 5, the +DCD detection circuit 45 detects the distortion on the positive side of the duty cycle. Meanwhile, the −DCD detection circuit 46 does not detect the distortion on the negative side of the duty cycle. Accordingly, the distortion on the positive side of the duty cycle is erroneously detected.

Further, if the distortion of the duty cycle is absent in the data signal but the phase of the data signal is delayed with respect to the phase of the clock signal, as illustrated in FIG. 6, the +DCD detection circuit 45 does not detect the distortion on the positive side of the duty cycle. Meanwhile, the −DCD detection circuit 46 detects the distortion on the negative side of the duty cycle. Accordingly, the distortion on the negative side of the duty cycle is erroneously detected.

However, if the clock data recovery circuit 14 is locked, i.e., if the phase of the data signal matches the phase of the clock signal, as in the examples illustrated in FIGS. 3 and 4, the distortion of the duty cycle can be accurately detected.

In the fourth method, the +DCD detection circuit 45 performs the fall PDDN signal detection, and the −DCD detection circuit 46 performs the rise PDUP signal detection.

According to the method, if the clock data recovery circuit 14 is not locked, and if the distortion of the duty cycle is absent in the data signal but the phase of the data signal is advanced with respect to the phase of the clock signal, as illustrated in FIG. 5, the +DCD detection circuit 45 does not detect the distortion on the positive side of the duty cycle. Meanwhile, the −DCD detection circuit 46 detects the distortion on the negative side of the duty cycle. Accordingly, the distortion on the negative side of the duty cycle is erroneously detected.

Further, if the distortion of the duty cycle is absent in the data signal but the phase of the data signal is delayed with respect to the phase of the clock signal, as illustrated in FIG. 6, the +DCD detection circuit 45 detects the distortion on the positive side of the duty cycle. Meanwhile, the −DCD detection circuit 46 does not detect the distortion on the negative side of the duty cycle. Accordingly, the distortion on the positive side of the duty cycle is erroneously detected.

However, if the clock data recovery circuit 14 is locked, the distortion of the duty cycle can be accurately detected also in the fourth method, similarly as in the third method.

In the case in which the distortion of the duty cycle is detected by the third or fourth method, the signal processing device 10 is configured such that an enable signal is input to the +DCD detection circuit 45 and the −DCD detection circuit 46 in the locked state of the clock data recovery circuit 14.

Subsequently, with reference to FIGS. 7 and 8, the operation of the adjustment value determination circuit 49 will be described.

FIG. 7 illustrates an example of the adjustment value increase or decrease table. As illustrated in FIG. 7, in the adjustment value increase or decrease table, the count subtraction value is associated with the increase or decrease in the duty adjustment value. In the example of FIG. 7, count subtraction values of +600≦, +200≦ and <+600, −200≦ and <+200, −600≦ and <−200, and <−600 are respectively associated with increases or decreases −2, −1, ±0, +1, and +2 in the duty adjustment value.

Therefore, on the basis of the adjustment value increase or decrease table of FIG. 7, if the count subtraction value is 600 or larger, the increase or decrease in the duty adjustment value is determined to be −2, and if the count subtraction value is 200 or larger and smaller than 600, the increase or decrease in the duty adjustment value is determined to be −1. Further, if the count subtraction value is −200 or larger and smaller than 200, the increase or decrease in the duty adjustment value is determined to be 0, and if the count subtraction value is −600 or larger and smaller than −200, the increase or decrease in the duty adjustment value is determined to be 1. Further, if the count subtraction value is smaller than −600, the increase or decrease in the duty adjustment value is determined to be 2.

For example, if the count value of the counter 47 is 500 and the count value of the counter 48 is 400, the count subtraction value is 100, and the increase or decrease in the duty adjustment value is determined to be 0. As a result, the duty adjustment value is not changed. Further, if the count value of the counter 47 is 200 and the count value of the counter 48 is 1000, the count subtraction value is −800, and the increase or decrease in the duty adjustment value is determined to be 2. As a result, the duty adjustment value is changed to a value resulting from addition of 2 to the present duty adjustment value.

Further, if the count value of the counter 47 is 600 and the count value of the counter 48 is 300, the count subtraction value is 300, and the increase or decrease in the duty adjustment value is determined to be −1. As a result, the duty adjustment value is changed to a value resulting from subtraction of 1 from the present duty adjustment value.

In the adjustment value increase or decrease table of FIG. 7, the increase in the duty adjustment value is set in two stages of +1 and +2, and the decrease in the duty adjustment value is set in two stages of −1 and −2. Therefore, the distortion of the duty cycle can be corrected faster than in a case in which the increase or decrease is set in one stage.

Further, in the adjustment value increase or decrease table, 0 is set as an increase or decrease in the duty adjustment value, i.e., a dead zone is provided. Therefore, jitter occurring in the data signal can be prevented.

Meanwhile, in a case in which the dead zone is not provided, an increase or decrease in the duty adjustment value constantly occurs even in the absence of the distortion of the duty cycle. Thus, the duty adjustment circuit 12 performs the adjustment of the duty cycle. As described later, the adjustment is performed by a change in the amount of delay of the rising or falling edge. Therefore, frequent adjustment causes jitter.

The adjustment value increase or decrease table may be externally changed to an optimal table in accordance with the state of the data signal. In this case, as well as the holding circuit, an interface (not illustrated) controllable by an external device is also provided in the adjustment value determination circuit 49.

Subsequently, with reference to the timing chart of FIG. 8, description will be made of a specific method of determining the increase or decrease in the duty adjustment value by using the adjustment value increase or decrease table of FIG. 7. In FIG. 8, lines indicating the count values are divided into solid lines indicating the count value of the counter 47 and dashed-dotted lines indicating the count value of the counter 48.

As illustrated in FIG. 8, the respective count values of the counters 47 and 48 are incremented during the time from the start to the end of a measurement period. Then, upon completion of the measurement period, the adjustment value determination circuit 49 subtracts the count value of the counter 48 from the count value of the counter 47 to obtain the count subtraction value. Then, with reference to the adjustment value increase or decrease table, the adjustment value determination circuit 49 determines the increase or decrease in the duty adjustment value corresponding to the thus obtained count subtraction value. As a result, the present duty adjustment value is determined to be the sum of the thus determined duty adjustment value and the previous duty adjustment value. Further, upon completion of the measurement period, the counters 47 and 48 are reset, and the next measurement period starts.

For example, upon completion of the first measurement period in FIG. 8, the adjustment value determination circuit 49 compares the count value of the counter 47 with the count value of the counter 48, and obtains a value equal to or larger than 600 as the count subtraction value. Then, with reference to the adjustment value increase or decrease table of FIG. 7, the adjustment value determination circuit 49 determines the increase or decrease in the duty adjustment value to be −2.

Thereafter, the adjustment value determination circuit 49 inputs to the duty adjustment circuit 12 a duty negative signal representing 2 as the decrease. Thereby, the duty adjustment value of the first measurement period in FIG. 8 is determined to be the sum of the increase or decrease −2 and the duty adjustment value 5 of the previous measurement period, i.e., 3. Further, upon completion of the first measurement period in FIG. 8, the counters 47 and 48 are reset, and the second measurement period starts.

Upon start of the second measurement period in FIG. 8, the respective count values of the counters 47 and 48 are incremented during the time until the completion of the second measurement period. Then, upon completion of the second measurement period in FIG. 8, the adjustment value determination circuit 49 compares the count value of the counter 47 with the count value of the counter 48, and obtains a value equal to or larger than 200 and smaller than 600, which is smaller than the count subtraction value of the previous measurement period, as the count subtraction value. Then, with reference to the adjustment value increase or decrease table of FIG. 7, the adjustment value determination circuit 49 determines the increase or decrease in the duty adjustment value to be −1.

Thereafter, the adjustment value determination circuit 49 inputs to the duty adjustment circuit 12 a duty negative signal representing 1 as the decrease. Thereby, the duty adjustment value of the second measurement period in FIG. 8 is determined to be the sum of the increase or decrease −1 and the duty adjustment value 3 of the first measurement period, i.e., 2. Further, upon completion of the second measurement period in FIG. 8, the counters 47 and 48 are reset, and the third measurement period starts.

As the above-described process is repeatedly performed, the count subtraction value based on the respective count values of the counters 47 and 48 is reduced to be −200 or larger and smaller than 200, and the duty adjustment value converges. The measurement period may be defined by time or by the number of edges of the data signal.

FIG. 9 illustrates a detailed configuration example of the duty adjustment circuit 12 of FIG. 1. The duty adjustment circuit 12 of FIG. 9 is configured to include a power supply 81 functioning as a differential amplifier, resistors 82 and 85, NMOS (N-Channel Metal Oxide Semiconductor) transistors 83 and 86, a current source 84, and current sources 87 and 88 which decrease the common voltage of the differential signal of the data signal.

In FIG. 9, the power supply 81 is connected to the drain of the NMOS transistor 83 via the resistor 82, and is connected to the drain of the NMOS transistor 86 via the resistor 85. The gate of the NMOS transistor 83 receives the input of a differential positive signal, which forms the differential signal of the data signal, as a differential input positive signal. Further, the gate of the NMOS transistor 86 receives the input of a differential negative signal, which forms the differential signal of the data signal, as a differential input negative signal. Further, the respective sources of the NMOS transistors 83 and 86 are connected to a VSS voltage source via the current source 84.

Further, a terminal A provided between the resistor 82 and the NMOS transistor 83 is connected to one end of the current source 87, and the other end of the current source 87 is connected to a VSS voltage source. The current source 87 receives the input of the duty positive signal from the adjustment value determination circuit 49, and sets the current value in accordance with the duty positive signal. A signal obtained at the terminal A is output to the comparator 13 as a differential negative signal forming the differential signal of the data signal. Hereinafter, the differential negative signal output to the comparator 13 will be referred to as the differential output negative signal.

A terminal B provided between the resistor 85 and the NMOS transistor 86 is connected to one end of the current source 88, and the other end of the current source 88 is connected to a VSS voltage source. The current source 88 receives the input of the duty negative signal from the adjustment value determination circuit 49, and sets the current value in accordance with the duty negative signal. Further, a signal obtained at the terminal B is output to the comparator 13 as a differential positive signal. Hereinafter, the differential positive signal output to the comparator 13 will be referred to as the differential output positive signal.

In the duty adjustment circuit 12 configured as described above, if the level of the differential input positive signal is at the H level, the NMOS transistor 83 is turned on, and the current from the power supply 81 flows through the resistor 82, the NMOS transistor 83, and the current source 84. As a result, the voltage of the differential output negative signal output from the terminal A is decreased, and the level of the differential output negative signal falls to the L level. Further, in this case, the level of the differential input negative signal is at the L level. Therefore, the NMOS transistor 86 is turned off, and the current from the power supply 81 does not flow thorough the resistor 85. As a result, the level of the differential output positive signal output from the terminal B rises to the H level.

Meanwhile, if the level of the differential input positive signal is at the L level, the NMOS transistor 83 is turned off, and the current from the power supply 81 does not flow through the resistor 82. Therefore, the level of the differential output negative signal output from the terminal A rises to the H level. Further, in this case, the level of the differential input negative signal is at the H level. Therefore, the NMOS transistor 86 is turned on, and the current from the power supply 81 flows thorough the resistor 85, the NMOS transistor 86, and the current source 84. As a result, the voltage of the differential output positive signal output from the terminal B is decreased, and the level of the differential output positive signal falls to the L level.

Further, the common voltage of the differential output negative signal changes in accordance with the current value set by the current source 87, and the common voltage of the differential output positive signal changes in accordance with the current value set by the current source 88.

Figure 12:
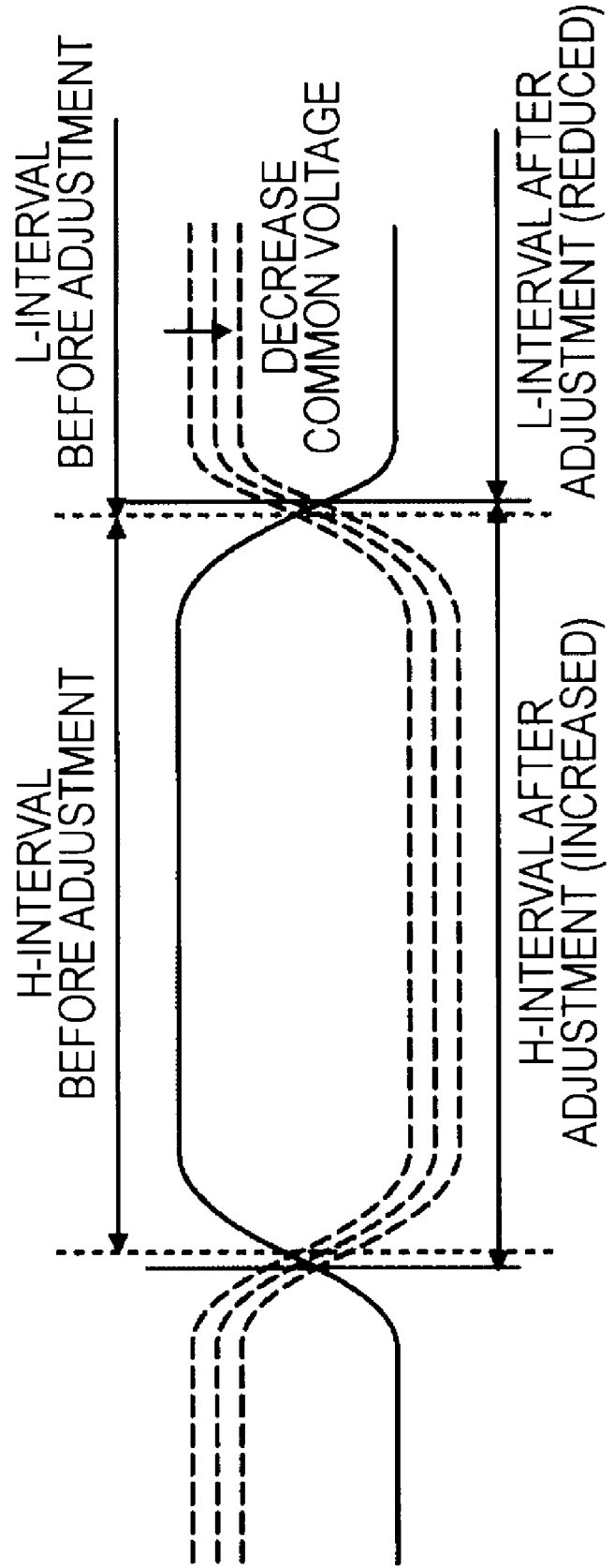
FIG. 12 is a diagram for explaining a change in common voltage when the increase or decrease in the duty adjustment value is +1 or larger.

With reference to FIGS. 10 to 12, the change in the common voltage will be described. In FIGS. 10 to 12, a solid line indicates the differential output positive signal, and a broken line indicates the differential output negative signal.

Firstly, if the increase or decrease in the duty adjustment value is 0, i.e., if any one of the duty positive signal and the duty negative signal is not input to the duty adjustment circuit 12, each of the current sources 87 and 88 sets the current value to be 0 μA. As illustrated in FIG. 10, therefore, the differential input positive signal is output directly as the differential output positive signal, and the differential input negative signal is output directly as the differential output negative signal. That is, a change in the common voltage does not occur in the differential output positive signal and the differential output negative signal.

As a result, in an H-interval and an L-interval in which the level of the single-ended data signal output by the comparator 13 is at the H level and the L level, respectively, there is no change between before and after the duty adjustment process. That is, the duty cycle of the data signal is not changed.

Meanwhile, if the increase or decrease in the duty adjustment value is −1 or smaller, i.e., if the duty negative signal is input to the duty adjustment circuit 12, the current source 88 sets a current value larger than 0 and corresponding to the decrease in the duty adjustment value represented by the duty negative signal. Specifically, the current source 88 sets the current value in a phased manner such that the larger the decrease in the duty adjustment value is, the larger the current value is.

Accordingly, the resistor 85 causes a voltage drop of a value corresponding to the decrease in the duty adjustment value, and the common voltage of the differential output positive signal is decreased, as illustrated in FIG. 11. As a result, the H-interval and the L-interval of the single-ended data signal output by the comparator 13 are reduced and increased, respectively, as compared with before the duty adjustment process. That is, the duty cycle of the data signal is adjusted toward the negative side, and therefore the distortion on the positive side of the duty cycle is corrected.

Meanwhile, if the increase or decrease in the duty adjustment value is +1 or larger, i.e., if the duty positive signal is input to the duty adjustment circuit 12, the current source 87 sets a current value larger than 0 and corresponding to the increase in the duty adjustment value represented by the duty positive signal. Specifically, the current source 87 sets the current value in a phased manner such that the larger the increase in the duty adjustment value is, the larger the current value is.

Accordingly, the resistor 82 causes a voltage drop of a value corresponding to the increase in the duty adjustment value, and the common voltage of the differential output negative signal is decreased, as illustrated in FIG. 12. As a result, the H-interval and the L-interval of the single-ended data signal output by the comparator 13 are increased and reduced, respectively, as compared with before the duty adjustment process. That is, the duty cycle of the data signal is adjusted toward the positive side, and therefore the distortion on the negative side of the duty cycle is corrected.

Due to the setting of the current value by the current source 87 or 88 in the phased manner and in accordance with the increase or decrease in the duty adjustment value, the distortion of the duty cycle can be corrected in a phased manner.

In the present specification, steps describing a program stored in a program recording medium include not only processes performed chronologically in the described order but also processes not necessarily performed chronologically but performed concurrently or individually.

Further, in the present specification, a system refers to the entirety of an apparatus configured to include a plurality of devices.

The present application contains subject matter related to that disclosed in Japanese Priority Patent Application JP 2008-077787 filed in the Japan Patent Office on Mar. 25, 2008, the entire content of which is hereby incorporated by reference.

Further, the embodiments of the present invention are not limited to the embodiment described above, and thus the present invention can be modified in a variety of ways within a scope not departing from the gist of the present invention.

What is claimed is:

1. A signal processing device comprising:
a correction circuit to correct a distortion of a duty cycle in a data signal having different occurrence probabilities of 0 and 1, wherein the correction circuit includes:
 a phase detection circuit to detect a difference between a phase of the data signal and a phase of a clock signal as an advance or a delay with respect to the clock signal;
 an edge detection circuit to detect a rising edge and a falling edge of the data signal;
 a distortion detection circuit to detect the distortion of the duty cycle upon determination that a difference between the phase of the data signal and the phase of the clock signal on the rising edge of the data signal is opposite to a difference between the phase of the data signal and the phase of the clock signal on the falling edge of the clock signal; and
 a duty adjustment circuit to adjust the duty cycle on the basis of the result of the detection by the distortion detection circuit to correct the distortion of the duty cycle.

2. The signal processing device according to claim 1,
wherein the correction circuit further comprises:
 an adjustment value determination circuit to determine, on the basis of a frequency of detection of the distortion by the distortion detection circuit, an increase or decrease in a duty adjustment value which represents the degree of adjustment by the duty adjustment circuit, and
wherein the duty adjustment circuit adjusts the duty cycle on the basis of the increase or decrease in the duty adjustment value.

3. The signal processing device according to claim 2,
wherein the distortion detection circuit detects the distortion on the positive side and the negative side of the duty cycle, and
wherein, when the difference between the frequency of detection of the distortion on the positive side of the duty cycle by the distortion detection circuit and the frequency of detection of the distortion on the negative side of the duty cycle by the distortion detection circuit is a value within a predetermined range, the adjustment value determination circuit determines the increase or decrease in the duty adjustment value to be zero.

4. The signal processing device according to claim 1,
wherein the distortion detection circuit detects the distortion of the duty cycle on the basis of the combination of the result of the detection by the phase detection circuit and the result of the detection by the edge detection circuit.

5. The signal processing device according to claim 1,
wherein the phase detection circuit includes an Alexander-type phase comparator.

6. A signal processing device comprising:
a correction means for correcting a distortion of a duty cycle in a data signal having different occurrence probabilities of 0 and 1, wherein the correction means includes:
 a phase detection means for detecting a difference between a phase of the data signal and a phase of a clock signal as an advance or a delay with respect to the clock signal;
 an edge detection circuit means for detecting a rising edge and a falling edge of the data signal;
 a distortion detection means for detecting the distortion of the duty cycle upon determination that a difference between the phase of the data signal and the phase of the clock signal on the rising edge of the data signal is opposite to a difference between the phase of the data signal and the phase of the clock signal on the falling edge of the clock signal; and a duty adjustment means for adjusting the duty cycle on the basis of the result of the detection by the distortion detection circuit to correct the distortion of the duty cycle.

7. A non-transitory computer readable medium having instruction stored thereon, which when executed by a processor in a signal processing device cause the processor to:

detect a difference between a phase of the data signal and a phase of a clock signal as an advance or a delay with respect to the clock signal;

detect a rising edge and a falling edge of the data signal;

detect a distortion of a duty cycle in the data signal upon determination that a difference between the phase of the data signal and the phase of the clock signal on the rising edge of the data signal is opposite to a difference between the phase of the data signal and the phase of the clock signal on the falling edge of the clock signal; and adjust the duty cycle on using the detection of the distortion of the duty cycle to correct the distortion of the duty cycle in the data signal, wherein the data signal has different occurrence probabilities of 0 and 1.

* * * * *